US010650798B2

(12) United States Patent
Cardinaux et al.

(10) Patent No.: US 10,650,798 B2
(45) Date of Patent: May 12, 2020

(54) ELECTRONIC DEVICE, METHOD AND COMPUTER PROGRAM FOR ACTIVE NOISE CONTROL INSIDE A VEHICLE

(71) Applicant: Sony Corporation, Tokyo (JP)

(72) Inventors: Fabien Cardinaux, Stuttgart (DE); Michael Enenkl, Stuttgart (DE); Marc Ferras Font, Stuttgart (DE); Thomas Kemp, Stuttgart (DE); Patrick Putzolu, Stuttgart (DE); Stefan Uhlich, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/361,264

(22) Filed: Mar. 22, 2019

(65) Prior Publication Data

US 2019/0304431 A1 Oct. 3, 2019

(30) Foreign Application Priority Data

Mar. 27, 2018 (EP) .................................... 18164228

(51) Int. Cl.

*G10K 11/16* (2006.01)
*H03B 29/00* (2006.01)
*G10K 11/178* (2006.01)
*H04R 1/40* (2006.01)
*H04R 3/00* (2006.01)

(52) U.S. Cl.

CPC ....... *G10K 11/17823* (2018.01); *H04R 1/403* (2013.01); *H04R 1/406* (2013.01); *H04R 3/005* (2013.01); *G10K 2210/1282* (2013.01); *G10K 2210/3044* (2013.01); *G10K 2210/3046* (2013.01)

(58) Field of Classification Search

CPC .. G10K 11/17823; H04R 1/403; H04R 1/406; H04R 3/005

See application file for complete search history.

(56) References Cited

U.S. PATENT DOCUMENTS

2012/0093320 A1 4/2012 Flaks et al.
2014/0294210 A1 * 10/2014 Healey .................... H04S 7/303 381/302
2015/0208166 A1 7/2015 Raghuvanshi et al.
2016/0037282 A1 2/2016 Giron (Continued)

OTHER PUBLICATIONS

DiBiase et al., "Robust Localization in Reverberant Rooms", Microphone Arrays, 2001, pp. 157-180.

(Continued)

*Primary Examiner* — Simon King
(74) *Attorney, Agent, or Firm* — Xsensus LLP

(57) ABSTRACT

A device for active noise control inside a vehicle, the device comprising a processor (7610) configured to determine a noise wavefield within the vehicle based on noise signals captured by a microphone array (M1-M10); determine the position of the ears of a passenger (P1) based on information obtained from a head tracking sensor (HTU1); capture a noise field inside the vehicle based on information obtained by the microphone array; obtain a noise level at the ears of the passenger (P1) from the noise field; and determine an anti-noise field based on the noise level at the position of the ears of the passenger.

10 Claims, 5 Drawing Sheets

(56) References Cited

U.S. PATENT DOCUMENTS

2016/0329040 A1 * 11/2016 Whinnery ............ G10K 11/178

OTHER PUBLICATIONS

PR Newswire, "Waves Audio Launches Nx Head Tracker via Kickstarter Campaign to Make the Immersive 3D Audio Experience a Reality", Waves Audio, Jun. 22, 2016, 2 pages.
"3D Audio on Headphones: How Does It Work?", Jun. 23, 2016, pp. 1-8.
James, "A Preview of Oculus' Newly Licensed Audio Tech Reveals Stunning 3D Sound", Oct. 8, 2014, pp. 1-4.
Burns, "Oculus Audio: VR earns integrated sound", Sep. 20, 2014, pp. 1-4.
Feltham, "Project Morpheus Using HRTF Audio, Unity Suggests", May 24, 2015, pp. 1-2.

* cited by examiner

ELECTRONIC DEVICE, METHOD AND COMPUTER PROGRAM FOR ACTIVE NOISE CONTROL INSIDE A VEHICLE

CROSS-REFERENCE TO RELATED APPLICATION

The present application claims priority to European Patent Application 18164228.1 filed by the European Patent Office on Mar. 27, 2018, the entire contents of which being incorporated herein by reference.

TECHNICAL FIELD

The present disclosure generally pertains to the technical field of active noise control (ANC), in particular to an electronic device, a method, and a computer program for active noise control inside a vehicle.

TECHNICAL BACKGROUND

Drivers in vehicles are often exposed to a lot of distracting and annoying noise. Such subsequently called "unwanted" noise can have multiple negative effects on drivers. The noise may annoy a driver and it may even dangerously decrease a driver's concentration.

Active noise control is based on the phenomenon of "destructive interference", in which a 180°-phase-shifted anti-noise signal is superimposed on the noise signal so that the noise is decreased significantly. Typically, one or more microphones detect the incoming noise, while a computer calculates a corresponding anti-noise signal which is emitted by one or more speakers to cancel out the incoming noise.

Noise cancellation inside a vehicle cannot be done inside a large volume, i.e. the volume in which the noise is cancelled is small. This poses a problem for ordinary systems, since the area of most effective cancellation might not cover the driver's ears, and hence the noise cancellation is not perceived by the driver. In addition, for immersive audio rendering systems, in particular for systems that make use of binaural cancellation, the sweet spot is very small and therefore such systems cannot be used in a generic way inside the vehicle.

SUMMARY

According to a first aspect, the disclosure provides an electronic device for active noise control inside a vehicle, the device comprising a processor configured to determine a noise wavefield within the vehicle based on noise signals captured by a microphone array; to determine the position of the ears of a passenger based on information obtained from a head tracking sensor; to capture a noise field inside the vehicle based on information obtained by the microphone array; to obtain a noise level at the ears of the passenger from the noise field; and to determine an anti-noise field based on the noise level at the position of the ears of the passenger.

According to a further aspect, the disclosure provides a system, comprising a microphone array, a loudspeaker array, and the electronic device as defined above, wherein the processor is configured to calculate an anti-noise field based on the noise level at the ears of a passenger and wherein the processor is further configured to render the anti-noise field with loudspeaker array.

According to a further aspect, the disclosure provides a method for active noise control inside a vehicle, the method comprising determining a noise wavefield within the vehicle based on noise signals captured by a microphone array; determining the position of the ears of the passenger based on information obtained from a head tracking sensor; capturing a noise field inside the vehicle based on information obtained by the microphone array; obtaining a noise level at the ears of a passenger from the noise field; and determining an anti-noise field based on the noise level at the position of the ears of the passenger.

According to a further aspect, the disclosure provides a computer program for active noise control inside a vehicle, the computer program comprising instructions which when executed on a processor cause the processor to: determine a noise wavefield within the vehicle based on noise signals captured by a microphone array; determine the position of the ears of a passenger based on information obtained from a head tracking sensor; capture a noise field inside the vehicle based on information obtained by the microphone array; obtain a noise level at the ears of the passenger from the noise field; and determine an anti-noise field based on the noise level at the position of the ears of the passenger.

BRIEF DESCRIPTION OF THE DRAWINGS

Embodiments are explained by way of example with respect to the accompanying drawings, in which.

DETAILED DESCRIPTION OF EMBODIMENTS

Figure 1:
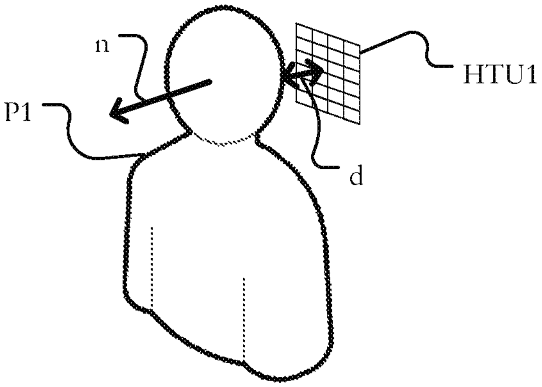
FIG. 1 schematically shows a head tracking sensor.

Before a detailed description of the embodiments under reference of FIG. 1, some general explanations are made.

The embodiments disclose an electronic device for active noise control inside a vehicle, the device comprising a processor configured to determine a noise wavefield within the vehicle based on noise signals captured by a microphone array; determine the position of the ears of a passenger based on information obtained from a head tracking sensor; capture a noise field inside the vehicle based on information obtained by the microphone array; obtain a noise level at the ears of the passenger from the noise field; and calculate an anti-noise field based on the noise level at the position of the ears of the passenger.

For spatial acoustic sensing, e.g. an acoustic noise cancelling application, the position of the head can be used to determine, via wavefield interpolation of a number of acoustic sensors in the front/back/sides of the passengers, the wavefield around a person's head, which then enables driving a standard Active Noise Control (ANC) system more accurately. In particular, such a system achieves improved noise cancellation performance at high frequencies, since virtual sensors are located much closer to the ears of the user than physical sensors can be.

The processor may for example be a microcomputer, for example a microcomputer of an electronic control unit (ECU) that is integrated in a vehicle control system.

The embodiments relate to an adjustment of audio beam size/rendering dependent on a user detection (or tracking). The embodiments disclose a noise cancellation technique which depends on estimation of a passenger's head position and orientation, in relative or absolute space.

Absolute positioning and orientation of user head can be determined by use of an acoustic (e.g. ultrasound) based sensing system, involving sophisticated signal processing and machine learning of signals bounced on and scattered by user/listener's head. Other means like camera based determination, or use of passive (pressure, IR, or capacitive proximity) sensor can also be employed.

Based on the detection of head positioning and orientation, a 3D rendering engine is employed for placing virtual audio source around passenger's head. Alternatively, a beam width and orientation adaptation is performed for optimal performance of audio beam-formed signal. Adaptation of orientation and width of beam-formed signal can be achieved using an array of loudspeakers.

Active noise cancellation is for example enhanced by the determination of a wavefield around a passenger's head.

The processor may be further configured to determine the position and orientation of the head of the passenger based on information obtained from the head tracking sensor, and to determine the position and the orientation of the ears of the passenger based on the position and the orientation of the head of the passenger.

The processor may be further configured to determine the orientation of the ears of the passenger based on information obtained from a head tracking sensor.

The processor may be configured to calculate the anti-noise field by determining one or more virtual sound sources. These one or more virtual sound sources may for example be monopole sound sources. The anti-noise field may for example be modelled as at least one monopole sound source placed at a defined target position, e.g. close to an ear of the passenger. The anti-noise field may for example be modelled as one single target monopole, or as multiple target monopoles placed at respective defined target positions, e.g. at the position of the passenger's ears. If multiple target monopoles are used to represent the target sound field, the methods of synthesizing the sound of a target monopole based on a set of defined synthesis monopoles may be applied for each target monopole independently, and the contributions of the synthesis monopoles obtained for each target monopole may be summed to reconstruct the target sound field. The simplest example of a monopole source would be a sphere whose radius alternately expands and contracts sinusoidal. It is also possible by using multiple monopole sound sources or algorithms such as wavefield synthesis to create a directivity pattern for virtual sound sources.

The head tracking sensor may for example be an acoustic based sensing system. The head tracking sensor may for example play acoustic waves close to the back of the head of a driver while sensing the signal bounced back from the head. Alternatively or in addition, the head tracking sensor may comprise a camera-based determination system or a passive sensor, a pressure sensor, an IR sensor, or capacitive proximity sensor, or the like.

The embodiments also disclose a system, comprising a microphone array, a loudspeaker array, and a device as described above, wherein the processor is configured to calculate an anti-noise field based on the noise level at the ears of a passenger and wherein the processor is further configured to render the anti-noise field with loudspeaker array. An array of microphones or several acoustic sensors may for example be distributed throughout the vehicle's in-cabin room. The processor may be configured to render the anti-noise field based on 3D audio rendering techniques.

The embodiments also disclose a method, comprising determining a noise wavefield within the vehicle based on noise signals captured by a microphone array; determining the position of the ears of the passenger based on information obtained from a head tracking sensor; capturing a noise field inside the vehicle based on information obtained by the microphone array; obtaining a noise level at the ears of a passenger from the noise field; and determining an anti-noise field based on the noise level at the position of the ears of the passenger. The method may perform any of the process described above and below in more detail.

The embodiments also disclose a computer program comprising instructions which when executed on a processor cause the processor to: determine a noise wavefield within the vehicle based on noise signals captured by a microphone array; determine the position of the ears of a passenger based on information obtained from a head tracking sensor; capture a noise field inside the vehicle based on information obtained by the microphone array; obtain a noise level at the ears of the passenger from the noise field; and calculate an anti-noise field based on the noise level at the position of the ears of the passenger.

The embodiments also relate to a tangible computer-readable medium storing instructions that perform the computer program defined above.

Head Tracking Sensor

FIG. 1 schematically shows head tracking sensor. The head tracking sensor HTU1 is located close to the back of the head of passenger P1 and is configured to play narrow-band and continuous acoustic waves close at the head of passenger P1 while sensing the signal bounced back from the head. According to this embodiment, the head tracking sensor HTU1 is an array of ultrasound apertures and sensors placed on the head rest behind the head of driver P1 (or, alternatively, close to the upper area in front of the driver's head). By doing sophisticated signal processing and machine learning of the signals bounced on and scattered by the driver's head, the distance d and orientation n of the head is determined. This involves a range finder type of algorithm together with the analysis of the scattered ultrasound signal coming from the head of passenger P1. Combining the relative distance and orientation of the head with knowledge about the position of the head tracking sensor HTU1 inside the vehicle, the position and orientation of the head and ears inside the vehicle is determined. The head tracking sensor has an accuracy of 1 cm or better so that the position and the orientation of the head of a passenger P1, respectively the position of the passenger's ears are determined with good accuracy.

Vehicle with 3D Audio Rendering System

Figure 2:
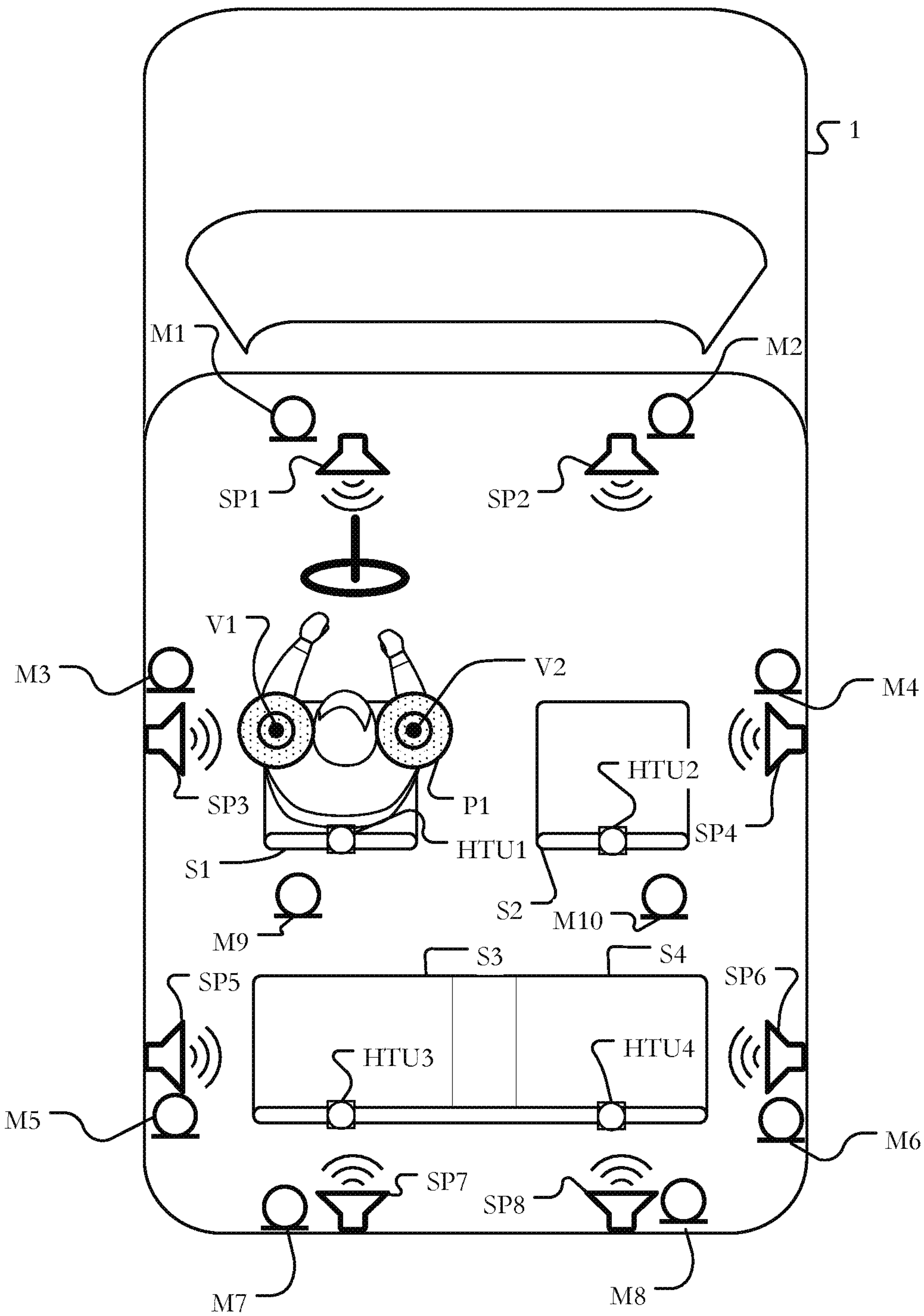
FIG. 2 schematically depicts a vehicle that comprises a 3D audio rendering system for active noise cancellation.

FIG. 2 schematically depicts, as an example, a vehicle that comprises virtual sound sources generated by 3D audio rendering. The vehicle 1 is equipped with four seats S1 to S4. The front seats S1, S2 are provided for a driver P1 and, respectively, a co-driver and the rear seats S3, S4 are provided for passengers at the rear of the vehicle 1. In vehicle 1, a driver P1 is sitting on seat S1.

Also in the vehicle, there are installed four head tracking sensors HTU1-HTS4 as described in FIG. 1 and the corresponding description above. The head tracking sensors HTU1-HTS4 are part of a passenger state detecting section (7510 in FIG. 5) and they are able to determine the position and the orientation of the passengers' heads inside vehicle 1. Head tracking sensor HTU1 determines the position and the orientation of the head of driver P1. The position and orientation of the driver's head is determined by using an acoustic ultrasound based sensing system that does not interfere with audio frequency band as described in FIG. 1 and corresponding description.

Within the vehicle, an array of microphones M1-M10 (see also In-vehicle information detecting unit 7500 of FIG. 5) is installed. Microphones M1, M2 are located at the instrument panel, microphones M3, M4, M5, M6 are located at the doors, microphones M7, M8 are located at the rear of the vehicle, and microphones M9, M10 are located in the roof of the vehicle. Each microphone M1-M10 determines the wavefield at its respective position. By interpolation over all captured wavefield data the local wavefield at the ears of driver P1 is determined. The microphones M1-10 detect the noise wavefield around the head of driver P1 and send this information via a communication network (7010 in FIG. 5) to a microcomputer (7610 in FIG. 5). The microcomputer calculates a 3D anti-sound field that cancels the noise in the direct environment of the head of driver P1.

The 3D anti-sound field calculated by the microcomputer is rendered by an array of loudspeakers SP1-SP8 which are installed in vehicle 1. Loudspeakers SP1, SP2 are located at the instrument panel, loudspeakers SP3, SP4, SP5, SP6 are located at the doors, and loudspeakers SP7, and SP8 are located at the rear of the vehicle. By means of 3D audio rendering, the speakers SP1 to SP10 are driven to generate a virtual sound field comprising virtual sound sources V1, V2 which are located close to the ears of the driver. Here, the virtual sound sources V1, V2 are monopole sound sources which radiate sound equally in all directions. The virtual sound sources V1, V2 are configured such that the interference field of all anti-sound waves at the ears of driver P1 have the same amplitude as the noise field at the driver's ears, but with inverted phase (also known as antiphase). The interference of all waves combine to a residual wave field, and effectively cancel each other out by destructive interference. This leads to the result that driver P1 does no longer hear noise. Destructive interference works best in a very small volume (about 10-20 cm diameter) so that it is beneficial that the microcomputer knows the position and orientation of the head of driver P1, and thus the position of the driver's ears with good accuracy (e.g. 1 cm or better).

For the immersive field generation (3D sound rendering), the exact position of the two ears of the user can be used to control the delay between the emitting speakers in such a way as to get the desired interference of the emitted waves exactly at the location of the ears of the listener. Methods that make use of interference to create 3D audio are called "cross-talk cancellation" or "multichannel decorrelation" in the literature.

As an alternative to the rendering of virtual sound sources a beam width and orientation adaptation may be performed for optimal performance of audio beam-formed signal. Adaptation of orientation and width of beam-formed signals can be achieved using an array of loudspeakers.

Active Noise Control (ANC) Based on Head Tracking Information

The head tracking sensors described with regard to FIGS. 1 and 2 above are able to track the position and orientation of a passenger's ears. This information is used in the Active noise control (ANC) process described below in more detail.

Figure 3:
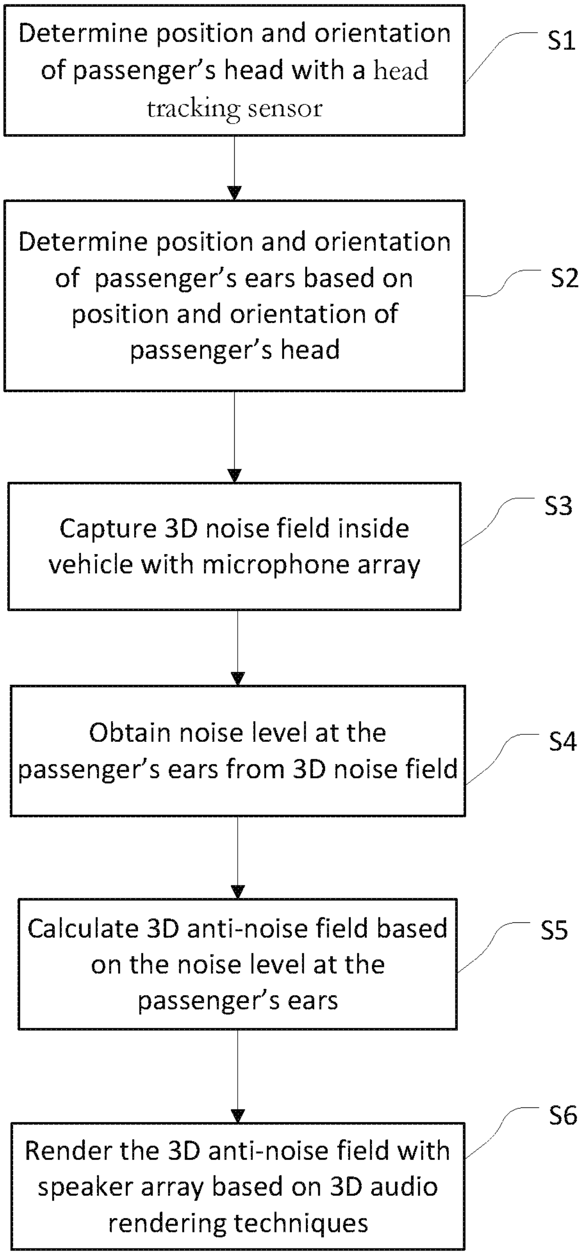
FIG. 3 provides a flowchart schematically describing a method for active noise cancellation using tracking data of a user's head.

FIG. 3 provides a flowchart schematically describing a process of active noise cancellation using data obtained by a head tracking sensor. The process may for example be performed by a processor of an electronic control unit (ECU) inside the vehicle.

At S1, a passenger's head position and head orientation are determined by means of a head tracking sensor. Determining a passenger's head position and head orientation by means of a head tracking sensor may for example be performed as described with regard to FIG. 1 above.

At S2, the position and orientation of the passenger's ears are determined based on the position and orientation of passenger's head. Determining the position and orientation of the passenger's ears based on the position and orientation of passenger's head may for example be based on a predefined head model of the passenger (e.g. information describing the relative position of the ear's with regard to the center of the head), or it may be based on a predefined standard head model, or it may be based on data obtained from the head tracking sensor that allows to conclude on the shape of the passenger's head. Information about the driver identity (obtained e.g. by image recognition, key identification, manual input, or the like) available to the in-vehicle processor may be used to identify the passenger and an appropriate head model.

At S3, the 3D noise field within the vehicle is captured with a microphone array. Capturing the 3D noise field within the vehicle with a microphone array may be achieved with any 3D sound recording technique known to the skilled person. For example, for estimating the sound level at desired points in the car, the SRP-PHAT (Steered Response Power Phase Transform) algorithm can be used, which is described in "Microphone Arrays: Signal Processing Techniques and Applications", Springer-Verlag, 2001, chapter "Robust Localization in Reverberant Rooms", pp. 157-180. Wavefield interpolation techniques, as known to the skilled person, can be used to estimate phase information.

At S4, the noise level at the passenger's ears is obtained from the captured 3D noise field. Obtaining the noise level at the passenger's ears from the captured 3D noise field may be achieved by evaluating the captured 3D noise field at the position of the passenger's ears.

At S5, a 3D anti-noise field is calculated based on the noise level at the passenger's ears. Calculating a 3D anti-noise field based on the noise level at the passenger's ears may be achieved by determining the noise level at the passenger's ears and creating a respective anti-noise signal. For example, virtual sound sources that emit anti-noise directly at the passenger's ears may be produced with any 3D audio rendering technique known to the skilled person, such as digitalized monopole synthesis which is described below in more detail.

At S6, the 3D anti-noise field is rendered with the loudspeaker array based on 3D audio rendering techniques. The rendering of the 3D anti-noise field with speaker array based on 3D audio rendering techniques may be based on any 3D audio rendering technique known to the skilled person, such as digitalized monopole synthesis which is described below in more detail.

System for Digitalized Monopole Synthesis

Figure 4:
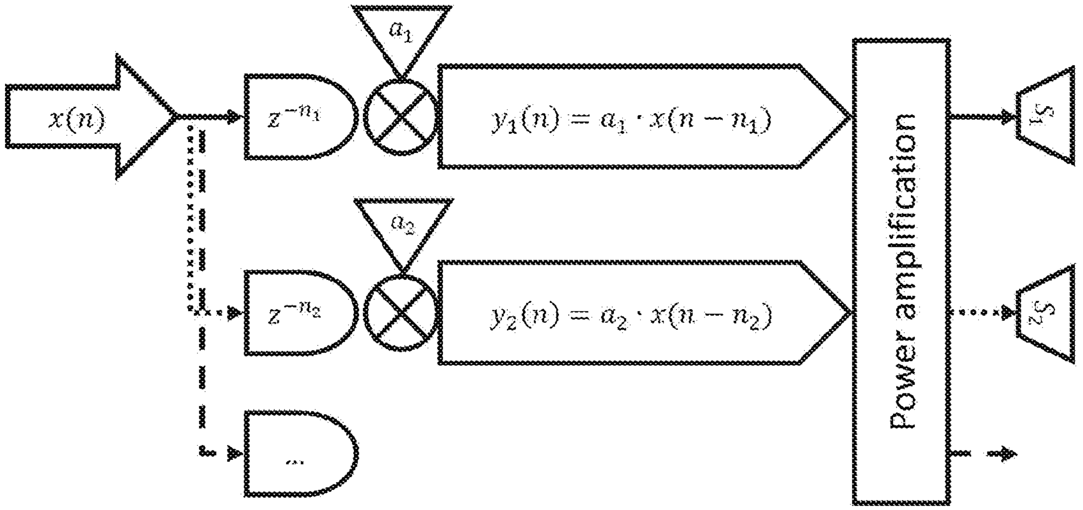
FIG. 4 provides a schematic diagram of a system applying a digitalized monopole synthesis algorithm.

FIG. 4 provides an embodiment of a system which implements a method that is based on a digitalized Monopole Synthesis algorithm in the case of integer delays.

The theoretical background of this system is described in more detail in patent application US 2016/0037282 A1 which is herewith incorporated by reference.

The technique which is implemented in the embodiments of US 2016/0037282 A1 is conceptually similar to the Wavefield synthesis, which uses a restricted number of acoustic enclosures to generate a defined sound field. The fundamental basis of the generation principle of the embodiments is, however, specific, since the synthesis does not try to model the sound field exactly but is based on a least square approach.

A target sound field is modelled as at least one target monopole placed at a defined target position. In one embodiment, the target sound field is modelled as one single target monopole. In other embodiments, the target sound field is modelled as multiple target monopoles placed at respective defined target positions. For example, each target monopole may represent a noise cancelation source comprised in a set of multiple noise cancelation sources positioned at a specific location within a space. The position of a target monopole may be moving. For example, a target monopole may adapt to the movement of a noise source to be attenuated. If multiple target monopoles are used to represent a target sound field, then the methods of synthesizing the sound of a target monopole based on a set of defined synthesis monopoles as described below may be applied for each target monopole independently, and the contributions of the synthesis monopoles obtained for each target monopole may be summed to reconstruct the target sound field.

A source signal x(n) is fed to delay units labelled by $z^{-n_p}$ and to amplification units $a_p$, where p=1, . . . , N is the index of the respective synthesis monopole used for synthesizing the target monopole signal. The delay and amplification units according to this embodiment may apply equation (117) to compute the resulting signals $y_p(n)=s_p(n)$ which are used to synthesize the target monopole signal. The resulting signals $s_p(n)$ are power amplified and fed to loudspeaker $S_p$.

In this embodiment, the synthesis is thus performed in the form of delayed and amplified components of the source signal x.

According to this embodiment, the delay $n_p$ for a synthesis monopole indexed p is corresponding to the propagation time of sound for the Euclidean distance $r=R_{p0}=|r_p-r_o|$ between the target monopole $r_o$ and the generator $r_p$.

Further, according to this embodiment, the amplification factor $$a_p = \frac{\rho c}{R_{p0}}$$

is inversely proportional to the distance $r=R_{p0}$.

In alternative embodiments of the system, the modified amplification factor according to equation (118) of US 2016/0037282 A1 can be used.

In yet further alternative embodiments of the system, a mapping factor as described with regard to FIG. 9 of US 2016/0037282 A1 can be used to modify the amplification.

Implementation

The technology according to an embodiment of the present disclosure is applicable to various products. For example, the technology according to an embodiment of the present disclosure may be implemented as a device included in a mobile body that is any of kinds of automobiles, electric vehicles, hybrid electric vehicles, motorcycles, bicycles, personal mobility vehicles, airplanes, drones, ships, robots, construction machinery, agricultural machinery (tractors), and the like.

Figure 5:
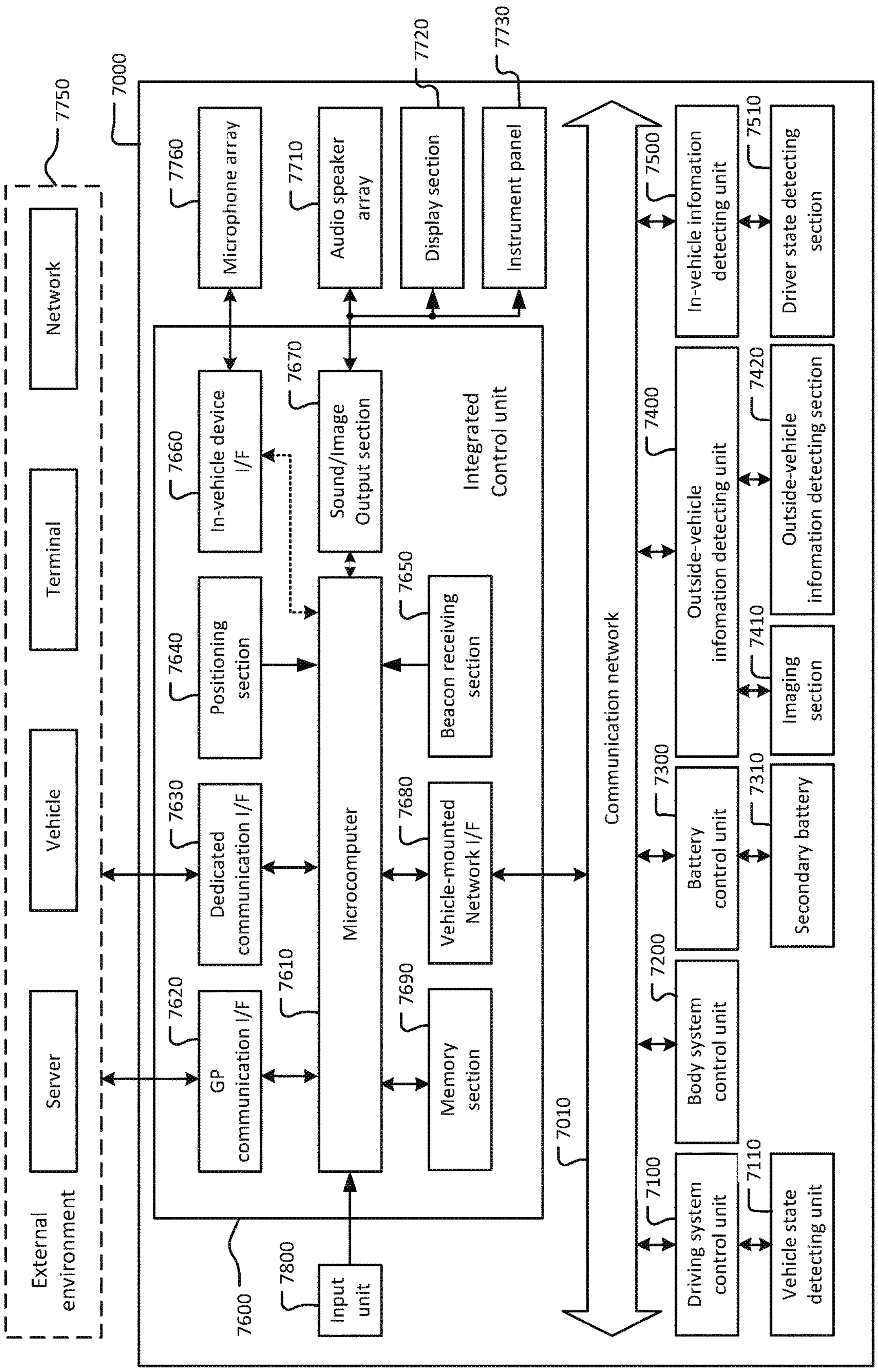
FIG. 5 is a block diagram depicting an example of schematic configuration of a vehicle control system.

FIG. 5 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 5, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 5 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a birds-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a passenger state detecting section 7510 that detects the state of a passenger (e.g. a driver). The passenger state detecting section 7510 includes the head tracking sensors (HTU1-HTS4 of FIG. 2) and it may include a camera that images the passengers, a biosensor that detects biological information of the passengers, a microphone array (array of microphones M1-M10 of FIG. 2) that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The input section 7800 comprises the microphone array (M1-10 in FIG. 2) described in the embodiments above. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), world-wide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 5, an audio speaker array 7710 (SP1-SP8 in FIG. 2), a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 5 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Incidentally, a computer program for realizing the functions of the information processing device 100 according to the present embodiment described with reference to FIG. Z can be implemented in one of the control units or the like. In addition, a computer readable recording medium storing such a computer program can also be provided. The recording medium is, for example, a magnetic disk, an optical disk, a magneto-optical disk, a flash memory, or the like. In addition, the above-described computer program may be distributed via a network, for example, without the recording medium being used.

In the vehicle control system 7000 described above, the information processing device 100 according to the present embodiment described with reference to FIG. Z can be applied to the integrated control unit 7600 in the application example depicted in FIG. 5. For example, the SS section 102, the TT section 104, and the UU section 106 of the information processing device 100 respectively correspond to the microcomputer 7610, the storage section 7690, and the vehicle-mounted network I/F 7680 of the integrated control unit 7600. For example, VV can be performed by the integrated control unit 7600 by performing VV. In addition, WW can be performed by XX by performing YY.

In addition, at least part of the constituent elements of the information processing device 100 described with reference to FIG. Z may be implemented in a module (for example, an integrated circuit module formed with a single die) for the integrated control unit 7600 depicted in FIG. 5. Alternatively, the information processing device 100 described with reference to FIG. Z may be implemented by a plurality of control units of the vehicle control system 7000 depicted in FIG. 5.

Aspects of the above described technology are also the following:

[1] An electronic device for active noise control inside a vehicle, the device comprising a processor (7610) configured to
- determine a noise wavefield within the vehicle based on noise signals captured by a microphone array (M1-M10);
- determine the position of the ears of a passenger (P1) based on information obtained from a head tracking sensor (HTU1);
- capture a noise field inside the vehicle based on information obtained by the microphone array;
- obtain a noise level at the ears of the passenger (P1) from the noise field; and
- determine an anti-noise field based on the noise level at the position of the ears of the passenger.

[2] The electronic device of [1], wherein the processor (7610) is further configured to
- determine the position and orientation of the head of the passenger (P1) based on information obtained from the head tracking sensor (HTU1) and
- to determine the position and the orientation of the ears of the passenger (P1) based on the position and the orientation of the head of the passenger (P1).

[3] The electronic device of [1] or [2], wherein the processor (7610) is further configured to determine the orientation of the ears of the passenger (P1) based on information obtained from a head tracking sensor (HTU1).

[4] The electronic device of anyone of [1] to [3], wherein the processor (7610) is configured to determine the anti-noise field by determining one or more virtual sound sources.

[5] The electronic device of anyone of [1] to [4], wherein the one or more virtual sound sources are monopole sound sources.

[6] The electronic device of anyone of [1] to [4], wherein the processor (7610) is configured to determine the anti-noise field by determining a beam width and orientation adaptation.

[7] The electronic device of anyone of [1] to [6], wherein the head tracking sensor is an acoustic based sensing system.

[8] A system, comprising
- a microphone array (M1-M10),
- a loudspeaker array (SP1-SP8),
- the electronic device of claim 1, wherein the processor (7610) is configured to calculate an anti-noise field based on the noise level at the ears of a passenger (P1) and wherein the processor (7610) is further configured to render the anti-noise field with loudspeaker array (SP1-SP8).

[9] The system of [8], wherein the processor (7610) is configured to render the anti-noise field based on 3D audio rendering techniques.

[10] A method for active noise control inside a vehicle, the method comprising
- determining a noise wavefield within the vehicle based on noise signals captured by a microphone array (M1-M10);
- determining the position of the ears of the passenger (P1) based on information obtained from a head tracking sensor (HTU1);
- capturing a noise field inside the vehicle based on information obtained by the microphone array;

obtaining a noise level at the ears of a passenger (P1) from the noise field; and determining an anti-noise field based on the noise level at the position of the ears of the passenger.

[11] A computer program for active noise control inside a vehicle, the computer program comprising instructions which when executed on a processor cause the processor to:

determine a noise wavefield within the vehicle based on noise signals captured by a microphone array (M1-M10);

determine the position of the ears of a passenger (P1) based on information obtained from a head tracking sensor (HTU1);

capture a noise field inside the vehicle based on information obtained by the microphone array;

obtain a noise level at the ears of the passenger (P1) from the noise field; and determine an anti-noise field based on the noise level at the position of the ears of the passenger.

[12] A tangible computer readable medium for active noise control inside a vehicle, the computer readable medium storing instructions which when executed on a processor cause the processor to:

determine a noise wavefield within the vehicle based on noise signals captured by a microphone array (M1-M10);

determine the position of the ears of a passenger (P1) based on information obtained from a head tracking sensor (HTU1);

capture a noise field inside the vehicle based on information obtained by the microphone array;

obtain a noise level at the ears of the passenger (P1) from the noise field; and determine an anti-noise field based on the noise level at the position of the ears of the passenger.

LIST OF REFERENCE SIGNS

1 vehicle
HTU1-HTS4 head tracking sensors
SP1-SP8 loudspeaker array
V1, V2 virtual sound sources
S1-S4 seats
M1-M10 microphone array
P1 driver/user
7000 vehicle control unit
7010 communication network
7100 driving system control unit
7110 vehicle state detecting unit
7200 body system control unit
7300 battery control unit
7310 secondary battery
7400 outside-vehicle information detecting unit
7410 imaging section
7420 outside-vehicle information detecting section
7500 in-vehicle information detecting unit
7510 passenger state detecting section
7600 integrated control unit
7610 microcomputer
7620 GP communication I/F
7630 Dedicated communication I/F
7640 positioning section
7650 beacon receiving section
7660 in-vehicle device I/F
7670 sound/image output section
7680 vehicle-mounted network I/F
7690 storage section
7710 audio speaker array
7720 display section
7730 instrument panel
7750 external environment
7760 in-vehicle device
7800 input unit

The invention claimed is:

1. An electronic device for active noise control inside a vehicle, the device comprising:

a processor configured to determine a noise wavefield within the vehicle based on noise signals captured by a microphone array;

determine a position of ears of a passenger based on information obtained from a head tracking sensor;

capture a noise field inside the vehicle based on information obtained by the microphone array;

obtain a noise level at the ears of the passenger from the noise field;

determine an anti-noise field based on the noise level at the position of the ears of the passenger; and, determine the anti-noise field by determining a beam width and orientation adaptation.

2. The electronic device of claim 1, wherein the processor is further configured to determine the position and orientation of the head of the passenger based on information obtained from the head tracking sensor, and determine the position and the orientation of the ears of the passenger based on the position and the orientation of the head of the passenger.

3. The electronic device of claim 1, wherein the processor is further configured to determine the orientation of the ears of the passenger based on information obtained from a head tracking sensor.

4. The electronic device of claim 1, wherein the processor is configured to determine the anti-noise field by determining one or more virtual sound sources.

5. The electronic device of claim 4, wherein the one or more virtual sound sources are mono-pole sound sources.

6. The electronic device of claim 1, wherein the head tracking sensor is an acoustic based sensing system.

7. A system, comprising a microphone array, a loudspeaker array, the electronic device of claim 1, wherein the processor is configured to calculate an anti-noise field based on the noise level at the ears of a passenger and wherein the processor is further configured to render the anti-noise field with loudspeaker array.

8. The system of claim 7, wherein the processor is configured to render the anti-noise field based on 3D audio rendering techniques.

9. A method for active noise control inside a vehicle, the method comprising:

determining a noise wavefield within the vehicle based on noise signals captured by a microphone array;

determining a position of ears of a passenger based on information obtained from a head tracking sensor;

capturing a noise field inside the vehicle based on information obtained by the microphone array;

obtaining a noise level at the ears of the passenger from the noise field;

determining an anti-noise field based on the noise level at the position of the ears of the passenger; and determining the anti-noise field by determining a beam width and orientation adaptation.

10. A non-transitory computer-readable medium storing executable instructions, which when executed by circuitry, cause the circuitry to perform a method for active noise control inside a vehicle, the method:

determine a noise wavefield within the vehicle based on noise signals captured by a microphone array;

determine a position of ears of a passenger based on information obtained from a head tracking sensor;

capture a noise field inside the vehicle based on information obtained by the microphone array;

obtain a noise level at the ears of the passenger from the noise field;

determine an anti-noise field based on the noise level at the position of the ears of the passenger; and determine the anti-noise field by determining a beam width and orientation adaptation.

* * * * *